(12) United States Patent
Tan et al.

(10) Patent No.: US 9,190,307 B2
(45) Date of Patent: Nov. 17, 2015

(54) APPARATUS FOR TRANSFERRING A SOLAR WAFER OR SOLAR CELL DURING ITS FABRICATION

(75) Inventors: Lian Hok Tan, Singapore (SG); Wen Ge Tu, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 588 days.

(21) Appl. No.: 13/397,820

(22) Filed: Feb. 16, 2012

(65) Prior Publication Data

US 2013/0216348 A1 Aug. 22, 2013

(51) Int. Cl.
*H01L 31/18* (2006.01)
*H01L 21/677* (2006.01)
*H01L 21/683* (2006.01)

(52) U.S. Cl.
CPC ...... *H01L 21/67766* (2013.01); *H01L 21/6838* (2013.01); *H01L 31/18* (2013.01)

(58) Field of Classification Search
CPC ........ B25J 9/003; B25J 9/0045; B25J 9/0048; B25J 9/04; B25J 9/041; B25J 9/104; B25J 9/126; B25J 15/0616; H01L 21/67766; H01L 21/6838
USPC ......... 414/589, 592, 608, 630, 659, 662, 663, 414/728, 744.1, 744.2, 744.4, 744.6, 749.1, 414/749.6, 752.1, 918; 901/17, 40
See application file for complete search history.

(56) References Cited

U.S. PATENT DOCUMENTS

| | | | | | |
|---|---|---|---|---|---|
| 3,218,069 | A | * | 11/1965 | Halberschmidt | ............... 271/69 |
| 4,620,831 | A | * | 11/1986 | Poncet et al. | ............... 414/744.3 |
| 4,787,813 | A | * | 11/1988 | Stevens et al. | ............. 414/744.5 |
| 4,921,395 | A | * | 5/1990 | Sahlin | ......... 414/744.3 |
| 5,741,113 | A | * | 4/1998 | Bacchi et al. | ............. 414/744.5 |
| 5,765,444 | A | * | 6/1998 | Bacchi et al. | ............. 74/490.03 |
| 5,789,890 | A | * | 8/1998 | Genov et al. | .................. 318/567 |
| 5,944,476 | A | * | 8/1999 | Bacchi et al. | ................. 414/783 |
| 6,037,733 | A | * | 3/2000 | Genov et al. | ............. 318/568.11 |
| 6,098,484 | A | * | 8/2000 | Bacchi et al. | ............. 74/490.03 |
| 7,063,499 | B2 | * | 6/2006 | Miyamoto | ................. 414/744.8 |
| 2001/0033144 | A1 | * | 10/2001 | Doi | .......................... 318/568.11 |
| 2002/0050322 | A1 | * | 5/2002 | Kunisawa et al. | ........ 156/345.11 |
| 2004/0112715 | A1 | * | 6/2004 | Miyamoto | ................. 198/471.1 |
| 2008/0121064 | A1 | * | 5/2008 | Todorov | ..................... 74/490.04 |

* cited by examiner

*Primary Examiner* — Saul Rodriguez
*Assistant Examiner* — Brendan Tighe
(74) *Attorney, Agent, or Firm* — Ostrolenk Faber LLP

(57) ABSTRACT

An apparatus for transferring a solar wafer or cell is disclosed, which comprises: i) a rotary motor; ii) a gripper for holding the solar wafer or cell; and a rotary arm connected between the rotary motor and the gripper, the rotary arm being drivable by the rotary motor in a first rotary direction through a transfer angle for transferring the solar wafer or cell between different positions. In particular, the apparatus further comprises an angle-compensating device configured to drive the gripper through a same transfer angle as the rotary arm in a second rotary direction opposite to the first rotary direction, to ensure that an angular orientation of the solar wafer or cell remains constant during rotation of the rotary arm.

8 Claims, 6 Drawing Sheets

APPARATUS FOR TRANSFERRING A SOLAR WAFER OR SOLAR CELL DURING ITS FABRICATION

FIELD OF THE INVENTION

The present invention relates to an apparatus for transferring a solar wafer or solar cell between different positions during its fabrication while maintaining the same wafer or cell orientation at pick and place locations.

BACKGROUND OF THE INVENTION

Solar cells are electrical devices that convert light energy into electrical energy using the photovoltaic ('PV') effect. By stringing solar cells together, a PV solar panel can be formed to provide a power generating device. Solar cells are increasingly being used as a backup power supply for various consumer products such as mobile phones and personal digital assistants.

Fabrication of solar cells involves a sequence of processing steps with solar wafers as the raw input material. Typically, pick and place robots are used to transfer solar wafers from their storage magazines to designated conveyers, which then convey the solar wafers to designated processing stations. An example of a processing station is a sorting station where 2D and 3D inspections may be performed on-the-fly by vision inspection modules to provide various measurements of the solar wafers such as wafer geometry, wafer thickness, bow and warp. Based on these measurements, the solar wafers are sorted accordingly and assembled into various storage magazines.

However, conventional pick and place robots employed in fabrication of solar wafers typically require multiple motion axes to ensure that an angular orientation of the solar wafers is maintained throughout the fabrication process. Consequently, in addition to a complex control system to ensure that the pick and place robots function properly, a large footprint is also required to provide sufficient space for operation of the multiple motion axes. Further, such pick and place robots are prone to machine downtime due to the complex construction of their multiple motion axes, which disadvantageously lowers throughput and efficiency. In addition, maintenance of such pick and place robots usually requires specialized skill which increases maintenance costs.

Thus, it is an object of this invention to seek to address the problems of conventional pick and place robots used in the fabrication of solar wafers and solar cells.

SUMMARY OF THE INVENTION

An aspect of this invention is an apparatus for transferring a solar wafer or a solar cell during its fabrication. The apparatus comprises: i) a rotary motor; ii) a gripper for holding the solar wafer or cell; and iii) a rotary arm connected between the rotary motor and the gripper, wherein the rotary arm is drivable by the rotary motor in a first rotary direction through a transfer angle for transferring the solar wafer or cell between different positions. In particular, the apparatus further comprises an angle-compensating device configured to drive the gripper through a transfer angle as the rotary arm in a second rotary direction opposite to the first rotary direction, such that an angular orientation of the solar wafer or cell remains constant during rotation of the rotary arm.

By providing the angle-compensating device configured to drive the gripper through the transfer angle in a rotary direction opposite to the rotary direction along which the rotary arm rotates, embodiments of the apparatus do not have to rely on pick and place robot with multiple motion axes to ensure that the angular orientation of the solar wafer or cell is maintained when transferring the solar wafer or cell during its fabrication. Thus, these embodiments of the apparatus are less prone to machine downtime which advantageously enhances the throughput and efficiency of the fabrication of solar wafers and cells.

Some optional features have been defined in the dependent claims.

For instance, the angle-compensating device may have an angle-compensating accuracy of between 0.1 and 1 degree, or between 0.5 and 1 degree.

Moreover, the angle-compensating device may comprise: i) a motor shaft connected to the rotary motor; ii) a gripper pulley connected to the gripper; and iii) an endless belt rotatably connected to the motor shaft and the gripper pulley. Specifically, the rotary arm is drivable by the rotary motor in the first rotary direction to drive the endless belt along a continuous path in the second rotary direction around the motor shaft. This, in turn, drives the gripper in the second rotary direction to ensure that the angular orientation of the solar wafer or cell remains constant as the solar wafer or cell is moved by the gripper between the different positions.

BRIEF DESCRIPTION OF THE DRAWINGS

The preferred embodiments will now be described, by way of example only, with reference to the accompanying drawings, of which.

DETAILED DESCRIPTION OF THE PREFERRED EMBODIMENTS

Figure 1:
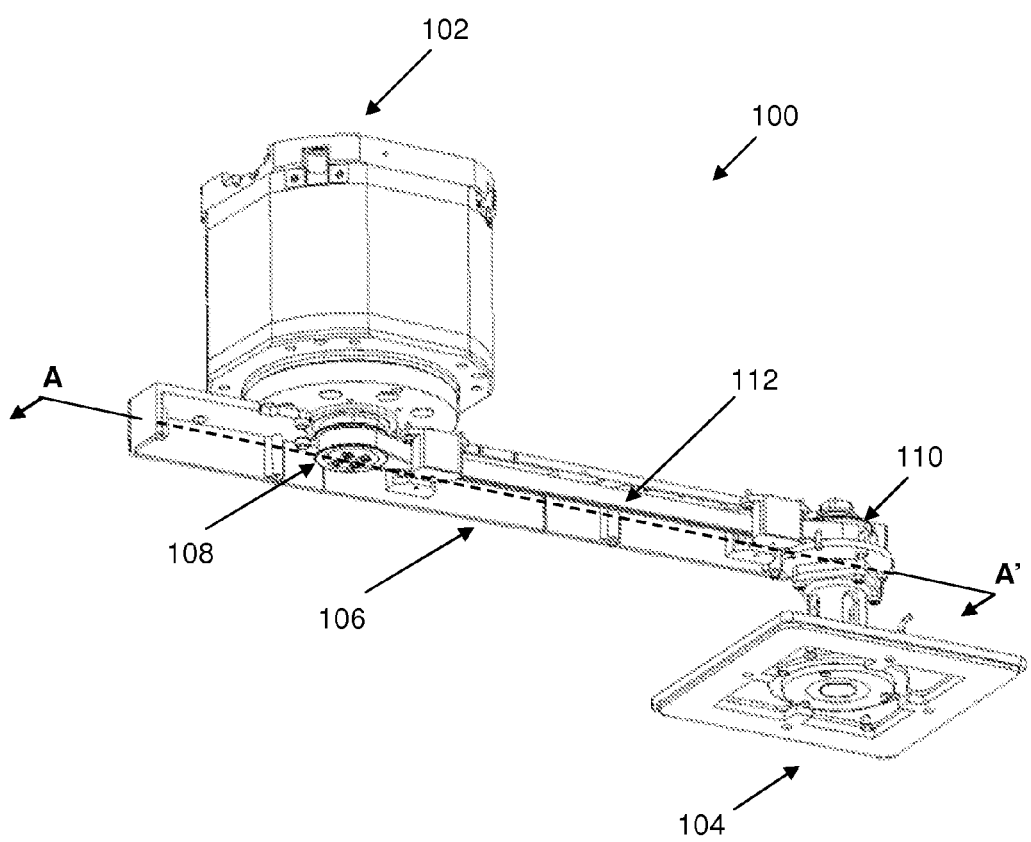
FIG. 1 is a perspective bottom view of a transfer apparatus according to an embodiment of the invention, comprising a gripper for transferring a solar wafer or cell during fabrication.

FIG. 1 is a perspective bottom view of a transfer apparatus 100 according to a preferred embodiment for transferring a solar wafer or cell during its fabrication. The transfer apparatus 100 comprises: i) a rotary motor 102; ii) a gripper 104 for holding a solar wafer or cell (not shown); and iii) a rotary arm 106 connected between the rotary motor 102 and the gripper 104. In particular, the rotary motor 102 is operative to drive the rotary arm 106 in a rotary clockwise and/or anti-clockwise direction to transfer the solar wafer or cell between different positions.

In addition, the transfer apparatus 100 comprises an angle-compensating device. When the rotary arm 106 is rotated by the rotary motor 102 in a clockwise direction through a transfer angle to transfer the solar wafer or cell from a first position to a second position, the angle-compensating device is operative to rotate the gripper in the opposite anti-clockwise direction through a same transfer angle as the rotary arm 106, so that an angular orientation of the gripper 104 remains constant after the solar wafer or cell is transferred to the second position. Accordingly, this also ensures that an angular orientation of the solar wafer or cell is maintained after it has been transferred by the transfer apparatus 100.

In particular, the angle-compensating device comprises: i) a motor shaft 108 connected to the rotary motor 102; ii) a gripper pulley 110 connected to the gripper 104; and iii) an endless belt 112 rotatably connected between the motor shaft 108 and the gripper pulley 110. Specifically, the motor shaft 108 is fixedly anchored to the rotary motor 102. In contrast to the motor shaft 108, the gripper pulley 110 is freely rotatable either in a clockwise or an anti-clockwise direction. Thus, when the rotary arm 106 is driven by the rotary motor 102 in the clockwise direction through the transfer angle to transfer the solar wafer or cell from the first to second position, the endless belt 112 is accordingly driven by the rotary arm 106 along a continuous path in the opposite anti-clockwise direction around the motor shaft 108. As the gripper pulley 110 is connected to the endless belt 112, the endless belt 112 in turn drives the gripper pulley 110 in the same anti-clockwise direction through the same transfer angle as the rotary arm 106. Consequently, the angular orientation of the solar wafer or cell remains constant as the solar wafer or cell is transferred by the gripper 104 from the first to the second position.

Figure 2:
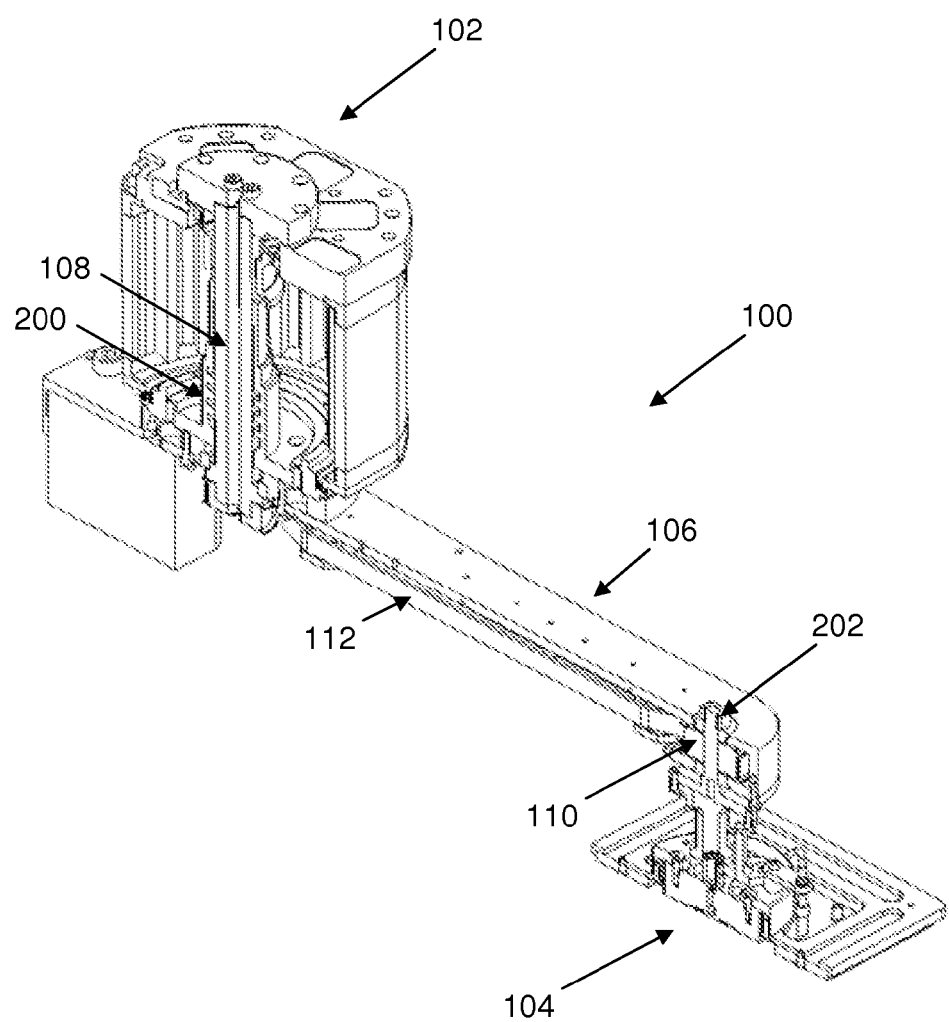
FIG. 2 is a perspective top view of the transfer apparatus of FIG. 1 with a portion thereof cut away along line A-A' as shown in FIG. 1.

FIG. 2 is a perspective top of the transfer apparatus 100 with a portion thereof cut away along line A-A' as shown in FIG. 1. It can be seen that the motor shaft 108 is housed in the rotary motor 102. Specifically, the motor shaft 108 is fixedly anchored within a central region of the rotary motor 102. The rotary motor 102 further comprises a rotor 200, which is the moving part of the rotary motor 102 and moves to rotate the rotary arm 106 either clockwise or anti-clockwise. It should be appreciated that the motor shaft 108 of the angle-compensation device may be a stator of the rotary motor 102, which is the stationary part of the rotary motor 102.

Referring to FIG. 2, it can also be seen that the gripper pulley 110 is connected to the gripper 104 via a gripper shaft 202. The gripper shaft 202 is fixedly connected to the gripper pulley 110 and the gripper 104. Thus, the gripper shaft 202 rotates together with the gripper pulley 110 in the same rotary direction when the gripper pulley 110 is driven by the endless belt 112. In turn, rotation of the gripper shaft 202 drives the gripper 104 to rotate in the same rotary direction. Consequently, the angular orientation of the solar wafer or cell can be maintained as the solar wafer or cell is transferred by the gripper 104 from the first to the second position.

An operation of the transfer apparatus 100 will now be described with reference to FIGS. 3a-3e.

Figure 3A:
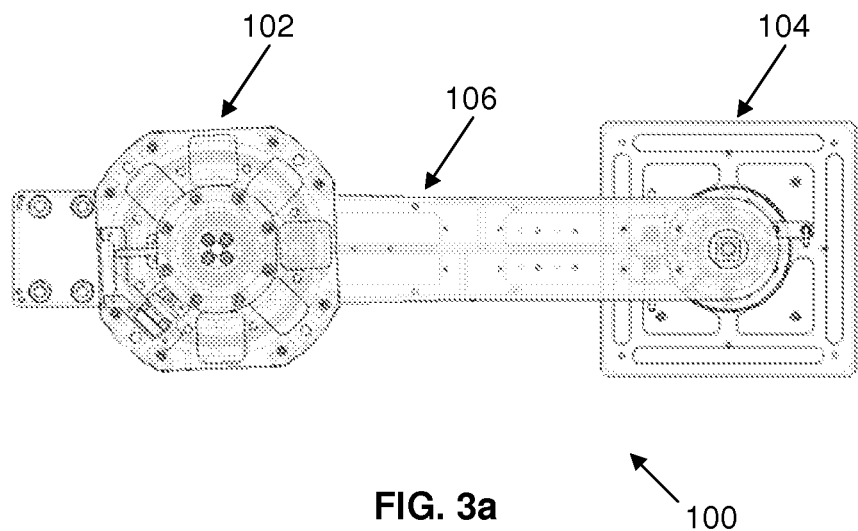
FIGS. 3a-3e illustrate an operation of the transfer apparatus of FIG. 1.

FIG. 3a shows a plan view of the transfer apparatus 100 when the rotary arm 106 is at a standby position.

Figure 3B:
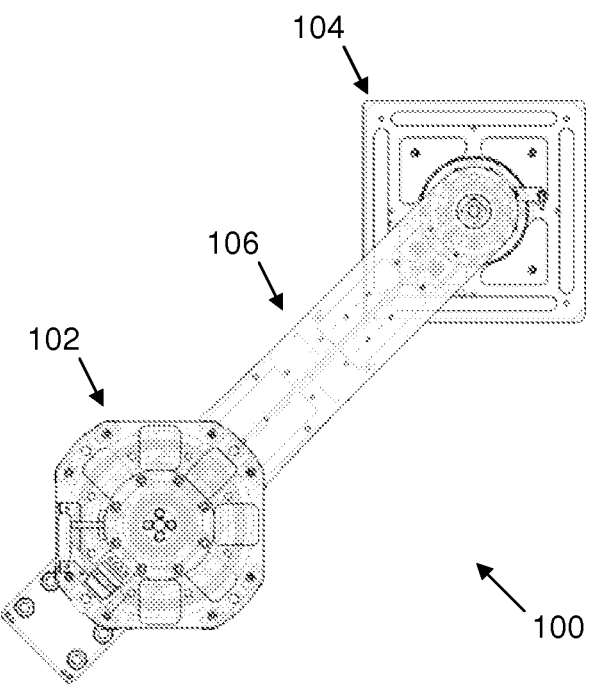

FIG. 3b shows a plan view of the transfer apparatus 100 when the rotary arm 106 has been driven by the rotary motor 102 in an anti-clockwise direction through a transfer angle of 45 degrees relative to the resting position of rotary arm 106. Specifically, rotation of the rotary arm 106 anti-clockwise accordingly drives the endless belt 112 to rotate along a continuous path in the opposite clockwise direction around the motor shaft 108. This, in turn, drives the gripper pulley 110 in the same clockwise direction through the transfer angle of 45 degrees, to maintain an angular orientation of the gripper 104 as the rotary arm 106 rotates anti-clockwise through the transfer angle. Since the gripper 104 is operative to hold a solar wafer or cell during fabrication, an angular orientation of the solar wafer or cell is likewise maintained as it is transferred by the gripper 104 between different positions.

Without the unique assembly of the motor shaft 108, the gripper pulley 110 and the endless belt 112 that make up the angle-compensating device, the gripper 104—which is fixed to the rotary arm 106—would rotate in the same rotary direction as the rotary arm 106 when the latter is driven the rotary motor 102. Consequently, the angular orientation of the gripper 104 continuously changes as the rotary arm 106 moves through the transfer angle.

Figure 3C:
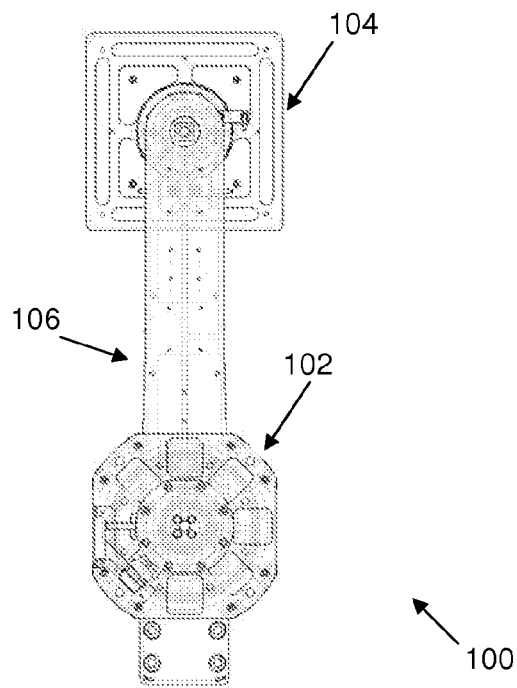
Figure 3D:
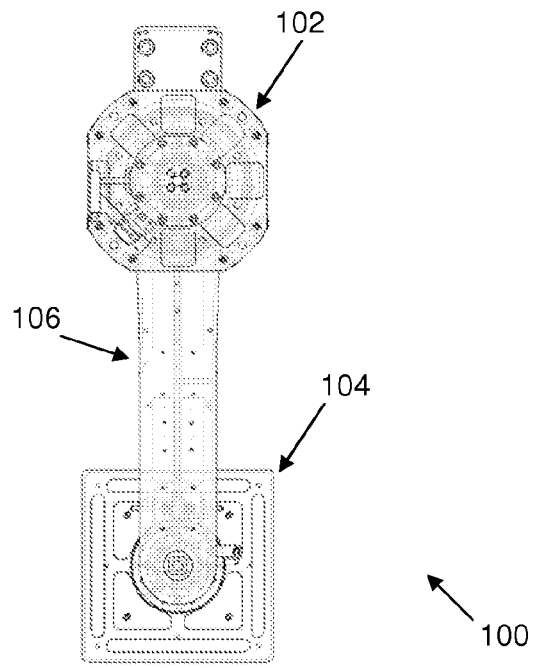
Figure 3E:
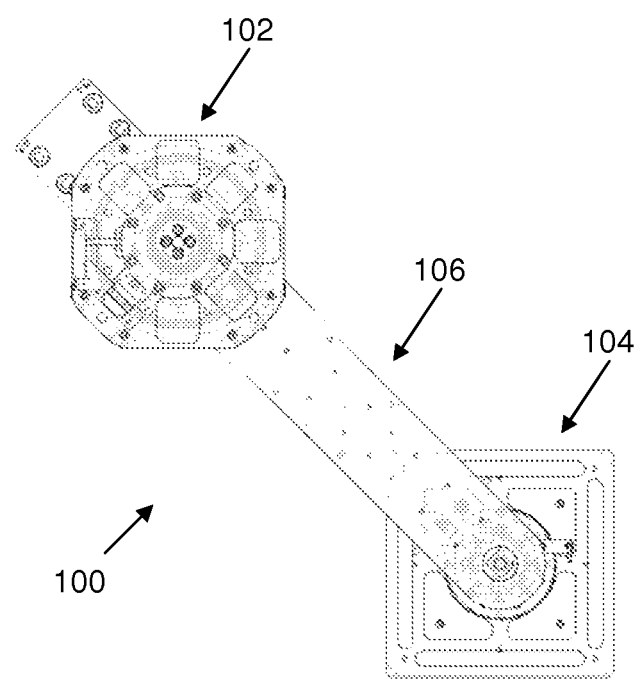

FIG. 3c shows another plan view of the transfer apparatus 100 after the rotary arm 106 has been driven through a transfer angle of 90 degrees relative to the standby position of the rotary arm 106, while FIG. 3d and FIG. 3e shows plan views of the same when the rotary arm 106 is driven through respective transfer angles of 270 degrees and 315 degrees relative to the standby position of the rotary arm 106.

It can be seen from each of FIGS. 3a-3e that the angular orientation of the gripper 104 is maintained as it is driven by the endless belt 112 through the various transfer angles. Accordingly, the angular orientation of the solar wafer or cell is likewise maintained as it is transferred by the gripper 104 through the various transfer angles.

Preferably, the angle-compensating device has an angle-compensating accuracy of between 0.1 and 1 degree, or between 0.5 and 1 degree.

By providing an angle-compensating device configured to drive the gripper 104 through a transfer angle in a rotary direction opposite to the rotary direction along which the rotary arm 106 rotates, the solar wafer or cell does not have to rely on a pick and place robot with multiple motion axes to ensure that its angular orientation with respect to a two-dimensional plane is maintained after it has been transferred between different positions on the two-dimensional plane. Further, the transfer apparatus having the angle-compensating device would be less prone to machine downtime which advantageously enhances the throughput and efficiency of the fabrication of solar wafers and solar cells.

Figure 4:
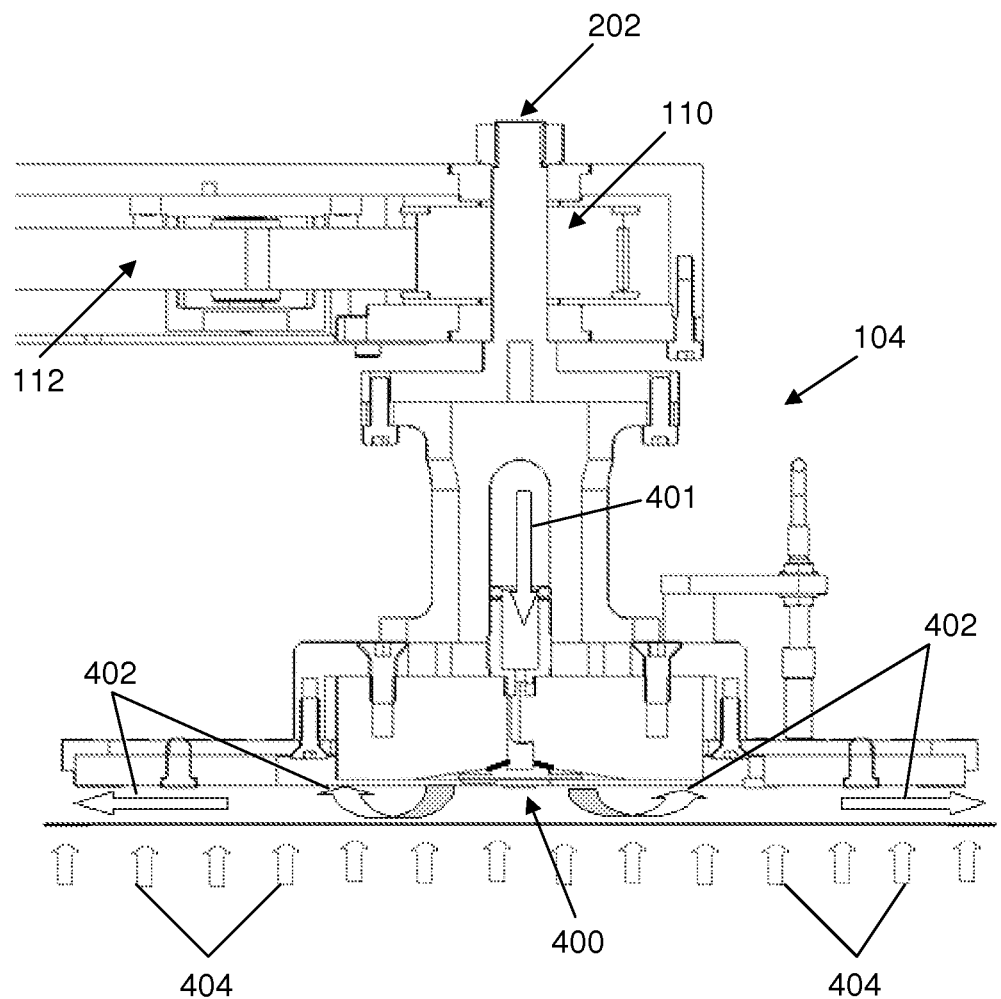
FIG. 4 illustrates the gripper of the transfer apparatus of FIG. 1.

FIG. 4 shows the gripper 104 of the transfer apparatus 100. Specifically, the gripper 104 comprises an air nozzle 400 operative to expel downwardly-directed air 401 from the gripper 104. During a pickup operation of the gripper 104, the air nozzle 400 is spaced from the solar wafer (or solar cell) by a small gap of, for example, 3 mm. In particular, the air nozzle 400 is configured such that the downwardly-directed air 401 that has been expelled from the gripper 104 produces a rapid air flow along the base of the gripper 104. This accordingly reduces the pressure of the gap between the base of the gripper 104 and the solar wafer (or the solar cell) to create an upward force 404 on the solar wafer (or the solar cell) towards the gripper 104 based on Bernoulli's principle. Thus, the solar wafer (or the solar cell) can be transferred by the gripper 104 between pick and place locations during the pickup operation.

It should also be appreciated that other embodiments of the invention are also possible without departing from the scope of the present invention. For instance, the transfer apparatus 100 may be configured to transfer the solar wafer or cell either between different positions across a single two-dimensional plane, or between different positions of two dimensional planes mutually displaced by a particular distance. Other gripper designs other than the one illustrated in FIG. 4 employing Bernoulli-induced gripping could be used with this angle-compensating device. Moreover, the endless belt 112 may be a timing belt mounted onto the motor shaft 108 and the gripper pulley 110.

The invention claimed is:

1. An apparatus configured to transfer a solar wafer or a solar cell, the apparatus comprising:
   a rotary motor;
   a gripper configured to hold the solar wafer or the solar cell;
   a rotary arm having a first end directly attached to a motor rotor of the rotary motor and a second end rotatably attached to the gripper, the rotary arm being drivable by the rotary motor in a first rotary direction through a transfer angle for transferring the solar wafer or the solar cell between different positions and the rotary arm being configured to orbit the gripper about a single stationary axis; and an angle-compensating device configured to drive the gripper to rotate by a same transfer angle as the rotary arm but in a second rotary direction that is opposite to the first rotary direction, such that an angular orientation of the solar wafer or the solar cell remains constant during rotation of the rotary arm, wherein the angle-compensating device comprises:

a stationary motor shaft of the rotary motor;

a gripper pulley of the gripper;

an endless belt being arranged on the stationary motor shaft and engaging the gripper pulley, the endless belt being movable relative to the stationary motor shaft and movable together with the gripper pulley, so that upon the rotary arm being driven by the rotary motor in the first rotary direction, the endless belt is accordingly driven by the rotary arm along a continuous path in the second rotary direction around the motor shaft, which accordingly drives the gripper in the second rotary direction to ensure that the angular orientation of the solar wafer or the solar cell is maintained as the solar wafer or the solar cell is moved by the gripper and as the rotary arm rotates about the single stationary axis.

2. The apparatus of claim 1, wherein the angle-compensating device has an angle-compensating accuracy of between 0.1 and 1 degree.

3. The apparatus of claim 1, wherein the stationary motor shaft is housed in the rotary motor.

4. The apparatus of claim 3, wherein the stationary motor shaft is anchored within a central region of the rotary motor.

5. The apparatus of claim 1, wherein the gripper pulley is connected to the gripper via a gripper shaft.

6. The apparatus of claim 1, wherein the endless belt is a timing belt.

7. The apparatus of claim 1, wherein the stationary motor shaft of the angle-compensating device is a stator of the rotary motor.

8. The apparatus of claim 1, wherein the gripper is a Bernoulli-effect gripper.

* * * * *